(12) United States Patent
Saito et al.

(10) Patent No.: US 6,735,857 B2
(45) Date of Patent: May 18, 2004

(54) METHOD OF MOUNTING A BGA

(75) Inventors: Yuji Saito, Tokyo (JP); Kozo Fukuzawa, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 09/931,003

(22) Filed: Aug. 17, 2001

(65) Prior Publication Data

US 2002/0020058 A1 Feb. 21, 2002

(30) Foreign Application Priority Data

Aug. 18, 2000 (JP) ..................... P2000-248624

(51) Int. Cl.$^7$ ................................ H05K 3/30
(52) U.S. Cl. .................... 29/840; 29/832; 29/843; 29/852; 174/262; 174/260; 361/774; 361/768; 228/180.21; 228/180.22
(58) Field of Search .................. 29/840, 832, 830, 29/843, 852; 361/777, 779, 774, 768, 792, 794; 174/262, 260; 257/737; 228/180.21, 180.22

(56) References Cited

U.S. PATENT DOCUMENTS 5,640,047 A * 6/1997 Nakashima ................ 257/738
5,722,160 A * 3/1998 Uemura et al. ............. 29/840
5,796,589 A * 8/1998 Barrow ..................... 361/774
6,115,913 A * 9/2000 Yamasaki et al. ........... 29/843
6,395,995 B1 * 5/2002 Joy et al. .................. 174/260
2002/0020058 A1 * 2/2002 Saito et al. ................ 29/840

FOREIGN PATENT DOCUMENTS

JP          11-4066          1/1999

* cited by examiner

*Primary Examiner*—Carl J. Arbes
*Assistant Examiner*—Minh Trinh
(74) *Attorney, Agent, or Firm*—Finnegan, Henderson, Farabow, Garrett & Dunner, L.L.P.

(57) ABSTRACT

Solder paste is applied beforehand onto through-hole upper lands (or solder) of a printed circuit board and attachment is effected by inserting solder joined to the BGA-side pads into the holes of the through-hole upper lands; solder and solder paste are then melted by heating, causing them to flow into the through-holes and to wet and spread out upon the through-hole bottom face lands, thereby effecting a soldered joint with the BGA-side pads and through-hole upper lands securely attached, and forming solder fillets. In this way, the quality of the solder joints can be ascertained by an ordinary external inspection method.

3 Claims, 6 Drawing Sheets

METHOD OF MOUNTING A BGA

CROSS-REFERENCE TO RELATED APPLICATION

This application claims benefit of priority to Japanese Application No. JP 2000-248624 filed Aug. 18, 2000, the entire content of which is incorporated by reference herein.

BACKGROUND OF THE INVENTION

1. Field of the Invention

The present invention relates to a method of mounting whereby a BGA (ball grid array) such as an FBGA (fine ball grid array) is soldered onto a printed circuit board.

2. Description of the Related Art

A prior art example of a method of mounting etc. whereby a BGA is soldered onto a printed circuit board is described using FIG. 1 to FIG. 5.

First of all, the method of mounting the BGA is described in FIG. 1 and FIG. 2.

FIG. 1 is a view showing the condition prior to mounting the BGA on the printed circuit board. The general structure of a BGA is that BGA-side pads 5 constituting electrodes are arranged in grid fashion on the underside of a BGA body 4 and solder balls 6 are connected to the surfaces of the BGA-side pads 5 (these electrodes are referred to as bump electrodes).

In order to mount a BGA on a printed circuit board, solder paste 3 is applied beforehand onto printed circuit board-side pads 2 constituting electrodes arranged in the same arrangement as the BGA-side pads 5 on the printed circuit board 7, and mounting is effected such that the solder balls 6 are superimposed on the printed circuit board-side pads 2. In FIG. 1, numeral 1 are through-hole upper lands, numeral 8 are through-hole internal portions, and numeral 9 are through-hole bottom lands. These 1, 8 and 9 are connected to the printed circuit board-sides pads 2, and then the printed circuit board-sides pads 2 are respectively connected to every circuit (not shown) via through-holes.

After mounting, the BGA and printed circuit board are heated in a reflow device or the like, not shown, so that soldering is effected by melting the solder 6 and solder paste 3.

FIG. 2 is a view showing the condition after the BGA has been mounted on the printed circuit board.

The molten solder 6 and solder paste 3 fuse to a single mass which wets and spreads out over printed circuit board-side pads 2, thereby forming a solder fillet (condition in which the BGA-side pads 5 and printed circuit board-side pads 2 are connected through bump electrodes) between the BGA-side pads 5 and printed circuit board-side pads 2, which are thus soldered together.

In this process, if the amount of solder paste 3 is too large, the solder spreads out, effecting joining between the printed circuit board-side pads 2 i.e. solder bridges 12 are produced. Also, if the amount of solder paste 3 supplied is too little or BGA solder balls are missing, soldering is not effected between the BGA-side pads 5 and the printed circuit board-side pads 2, giving rise to solder gaps 11 (condition in which the amount of solder is too little).

In the case of the solder joints of ordinary mounted components, not shown, the presence of solder gaps or solder bridges can be ascertained by visual observation of the solder fillets formed between the leads or electrodes and the pads of the printed circuit board of the mounted components, since the mounted components are on the outside. Also, the condition of the solder fillets can be automatically inspected using a soldering appearance inspection device which makes use of a camera and/or laser to make this visible to the eye.

FIG. 3 is a view of a transmission image obtained using X-rays of solder joints of a BGA and printed circuit board pads. The lead contained in solder 6 does not easily transmit X-rays and so shows up as dark patches in the transmission image. The transmission image of normal solder joints appears circular, but in the condition where there is a solder bridge 12, an oval-shaped transmission image is produced between adjacent pads.

Also, in the case of a solder gap 11, since the amount of solder is small, a transmission image of a smaller circular shape than the transmission image of a normal soldered joint is produced. Thus, since the BGA solder fillets are sandwiched between the printed circuit board 7 and BGA body 4, they are not visible to the naked eye and it is necessary to observe their transmission images using X-rays etc. Thus the inspection step of a printed circuit board on which a BGA was mounted was performed divided into separate steps for the BGA section and the other mounted components.

FIG. 4 is a view showing a condition in which the BGA is removed using a repair device.

In the ordinary method of repairing soldering defects of mounted components, not shown, in the case of solder bridges, the location thereof is heated using a soldering iron and the solder is removed by melting. Also in the case of solder gaps, the location of the gap is heated with a soldering iron and repair is effected by supplying solder thereto.

However, in order to repair a BGA, an expensive special-purpose repair device is required. When solder bridges 12 of adjacent printed circuit board-side pads 2 occur or solder gaps 11 of BGA-side pads 5 and printed circuit board-side pads 2 occur, even though these occur at only a single location of a BGA having some hundreds of soldering joint locations, the entire BGA must be removed and a new BGA re-mounted.

As shown in FIG. 4, regarding the method of removing the BGA, removal from the printed circuit board is effected by heating printed circuit board 7 from below using a heater 16 and raising the BGA body 4 by suction using a suction nozzle 15, after melting all of the solder of the BGA by using a heated air current nozzle 14 to heat the BGA by blowing onto it, from above the BGA, a current of hot air from a heated air current generator, not shown. Since the solder of the BGA-side pads 5 of this BGA that has been removed has become nonuniform, it cannot be reused. Solder remaining behind on the printed circuit board-side pads 2 is flattened using a solder suctional removal device, not shown.

Next, the method of remounting the BGA is that a new BGA is prepared, and positional location is performed by suctional attachment of the BGA using suction nozzle 15, after which, in the same way as in the case of removal from the printed circuit board, heating is effected from below printed circuit board 7 using a heater 16 and heating of the upper side of the BGA is effected by blowing onto the BGA by a heated air current nozzle 14 a current of hot air from a heated air current generator, not shown, thereby melting all of the solder 6 of the BGA to effect soldering.

FIG. 5 is a view showing the condition in which heat radiating fins 17 of the BGA are mounted.

BGA packages are often employed in computer CPUs or MPUs and the amount of heat generated on passage of current is increasing as the speeds of the CPUs or MPUs are increased.

However, with the conventional method of BGA mounting, a soldering portion gap is present between the BGA body 4 and printed circuit board 7, so heat removal by transfer of heat to the printed circuit board was not possible. Heat radiating fins 17 or the like were therefore necessary to allow the heat to escape. Since the heat radiating fins 17 were mounted on the top of the BGA body 4, they presented an obstacle to reducing the thickness of the product.

As described above, in inspecting solder joints of a BGA using the conventional BGA mounting method, the inspection had to be divided into two inspection processes, namely, inspection of the soldered joints of the ordinary mounted components and inspection of the BGA soldered joints. For inspection of the BGA solder joints, an expensive X-ray apparatus was necessary. This therefore increased the inspection costs due to increase in the number of inspection steps and tended to prolong the lead time for manufacturing printed circuit boards. In addition, there was a problem that an expensive repair device was necessary for repairing defects in BGA soldered joints. Also, since heat is generated on passage of current through the BGA, heat radiating fins and/or a heat removal fan had to be provided.

SUMMARY OF THE INVENTION

Accordingly, one object of the present invention is to provide a novel BGA mounting method wherein the foregoing problems can be eliminated, wherein checking of the quality of BGA soldered joints is possible by a method of inspecting the external appearance of the soldering of the solder joints as is done in the case of ordinary mounted components, an X-ray apparatus and repair device are not required, and mounting can be realized that copes with demands for reduction in weight, thickness, length and size and reduction in lead time.

In order to achieve the above object, the present invention is constructed as follows. Specifically, it consists in a BGA mounting method in which a BGA is soldered onto a printed circuit board wherein solder paste is applied beforehand onto at least one of lands of the printed circuit board which are in the position of through-holes of the printed circuit board and solder balls of the BGA which are connected with pads of the BGA; attachment is effected such that the through-holes of the printed circuit board and the solder balls of the BGA are superimposed; by heating the BGA and the printed circuit board, the solder balls and the solder paste are melted and flow into the through-holes, being led into the through-hole bottom face lands which they wet and where they spread out; and the pads of the BGA are stuck securely together with the lands of the printed circuit board which are in the positions of the through-holes of said printed circuit board and effect solder joints therewith, and solder fillets are formed on said through-hole bottom face lands.

With the present invention, the quality of the solder joints of the BGA can be ascertained by observing the solder fillets formed on the BGA through-hole bottom face lands.

It therefore also becomes possible to apply an automatic soldering inspection device such as is employed for solder fillet inspection of ordinary mounted components, thereby enabling the inspection time to be greatly reduced.

Also, since even if excess solder paste is supplied, the excess solder melted by heating is drawn through the through-holes by the capillary effect (capillary action, or capillarity) and wetting effect of the through-holes and collects on the through-hole bottom face lands, so no solder bridges are generated on the BGA pad side.

Furthermore, even if soldering gaps are generated at locations where BGA solder balls are absent, these can be repaired by supplying solder by applying heat from the through-hole bottom face lands.

Also according to the present invention, if the through-hole volume is $V_{TH}$ and the solder volume of the hemispheres on the through-hole bottom face lands is $V_{LAND}$, the total amount of solder $V_{SOLDER}$ obtained by adding the solder and the solder paste required for solder joining of the BGA pads and the lands of the printed circuit board which are in the positions of the through-holes of the printed circuit board is in the range $V_{TH} < V_{SOLDER} < V_{TH} + V_{LAND}$.

As a result of evaluation tests of this BGA mounting method it has been found that if the amount of solder within the through-holes is small, the surface tension of the solder acts in the direction of the interior of the through-holes, causing the solder to separate from the BGA pads, resulting in soldering gaps.

Also, if the amount of solder is too great, the solder assumes a condition in which it swells up on the through-hole bottom face lands, making contacts with solder on adjacent through-hole bottom face lands, producing solder bridges. From results of these evaluation tests, the amount of solder necessary for the BGA mounting can be accurately calculated in accordance with the volume of the through-holes.

According to the present invention, the appropriate amount of solder can be calculated in a straightforward fashion for any combination of sizes of the BGA solder balls and the through-holes, so stable BGA mounting can be achieved with no solder defects.

Also design standards can be established for the pad sizes and the through-hole diameters etc. of the printed circuit boards to which the present method of BGA mounting is applied.

Furthermore, according to the present invention, a ground layer pattern may be provided in a position of the printed circuit board corresponding to the position of the silicon chip of the BGA, and the BGA body and the ground layer pattern securely stuck together.

According to the present invention, efficient radiation of the heat generated by passage of current through the BGA can be achieved. Also, heat radiating fins and/or a heat removal fan are unnecessary, making it possible to reduce the thickness of the product.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
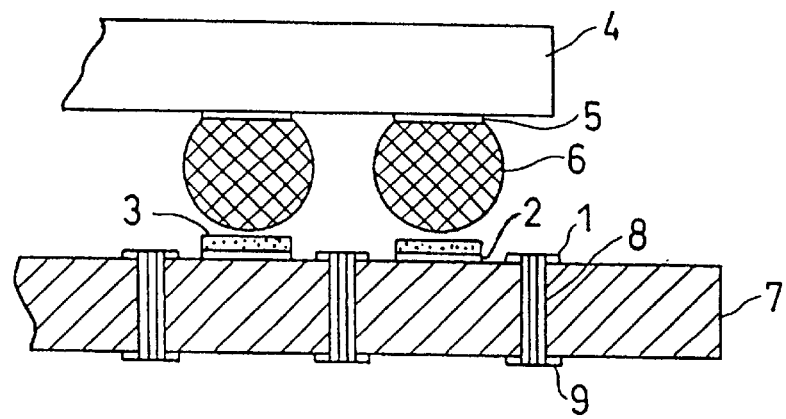
FIG. 1 is a detail cross-sectional view illustrating the condition prior to mounting in a prior art example.
Figure 2:
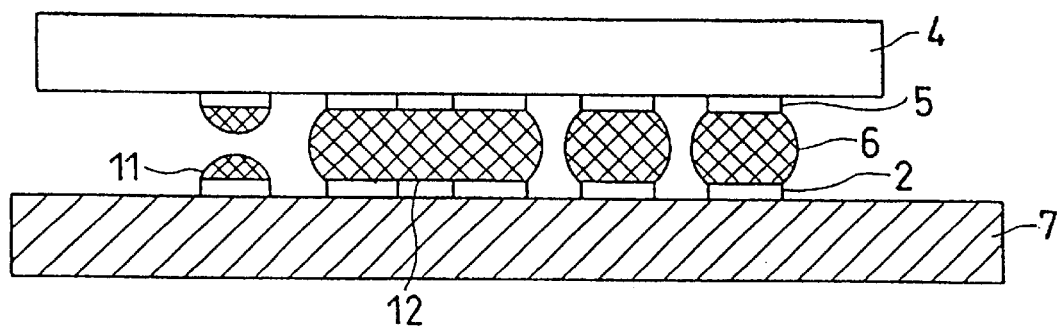
FIG. 2 is a detail cross-sectional view illustrating the condition after mounting in the prior art example.
Figure 3:
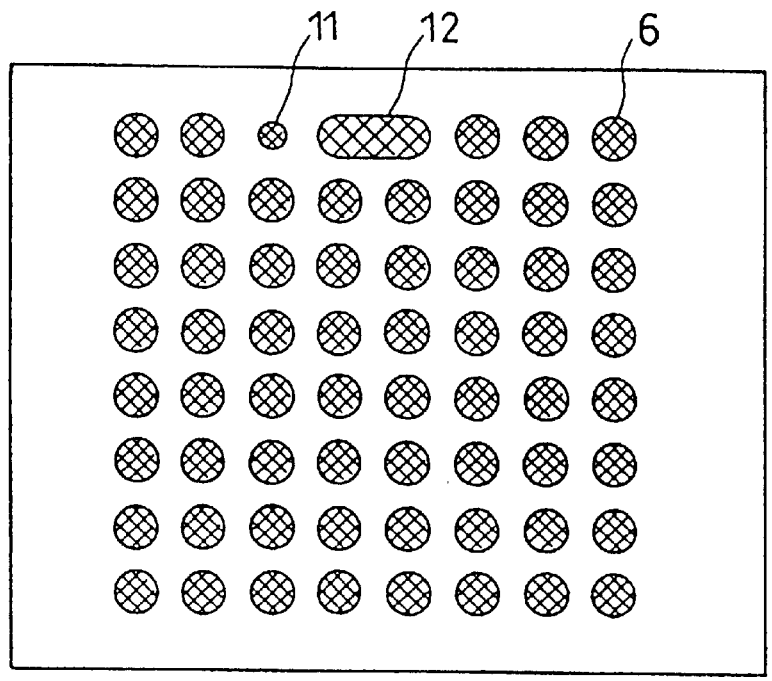
FIG. 3 is a plan view illustrating an X-ray transmission image after mounting in the prior art example.
Figure 4:
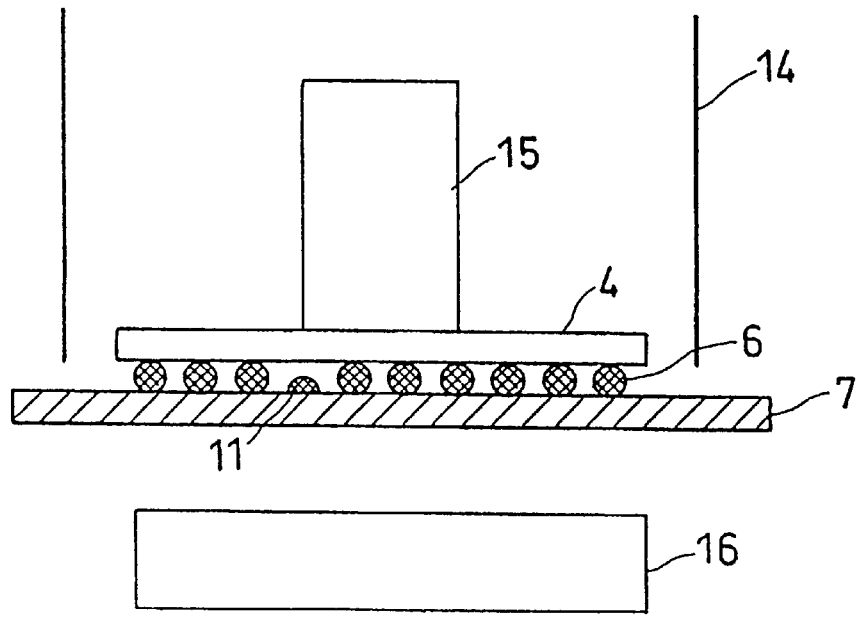
FIG. 4 is a detail cross-sectional view illustrating a repaired condition after mounting in the prior art example.
Figure 5:
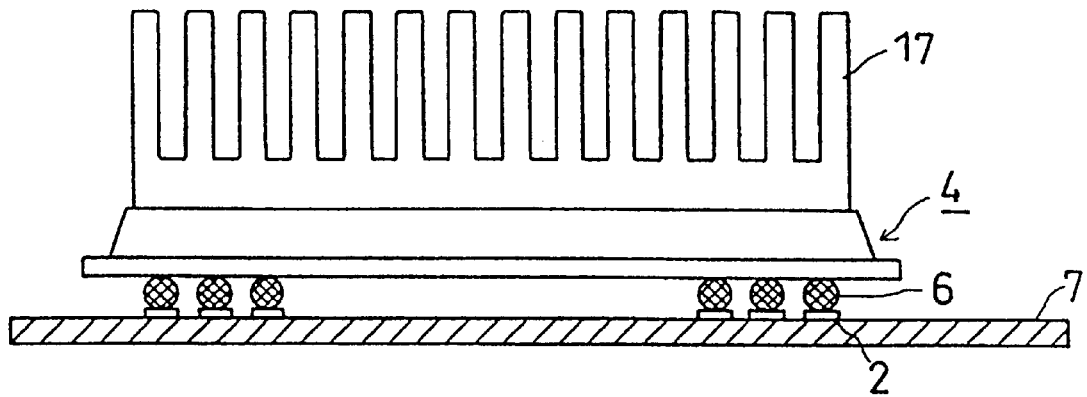
FIG. 5 is a detail cross-sectional view illustrating the condition after installing heat radiating fins after mounting in the prior art example.

Referring now to the drawings, wherein like reference numerals designate identical or corresponding parts throughout the several views, and more particularly to FIG. 6 thereof, one embodiment of the present invention will be described.

In the following figures, identical reference symbols designate identical parts or corresponding parts.

First Embodiment

A BGA mounting method according to a first embodiment of the present invention is described with reference to FIG. 6 to FIG. 8.

Figure 6:
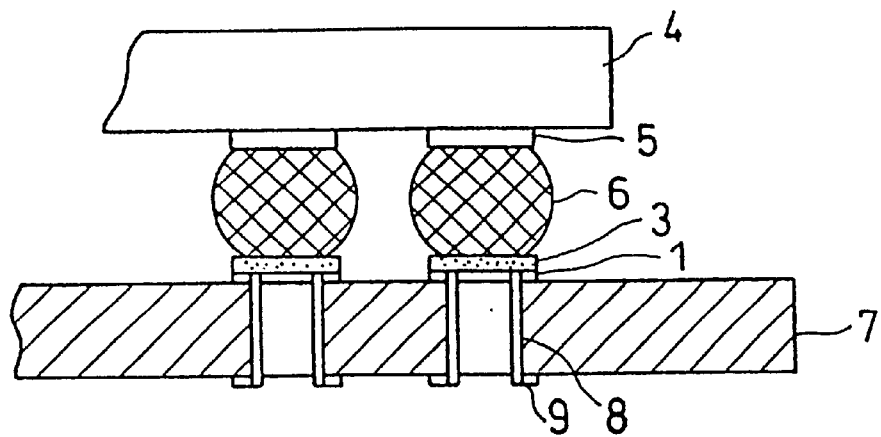
FIG. 6 is a detail cross-sectional view illustrating the condition prior to mounting in a first embodiment of the present invention.

FIG. 6 is a view showing the condition prior to mounting of the BGA on a printed circuit board. As shown in this Figure, the general construction of the BGA is that BGA-side pads 5 are arranged in grid fashion as electrodes on the underside of BGA body 4 and, in addition, solder balls 6 are connected to the surface of the BGA-side pads 5. Also, the general construction of the printed circuit board is that through-hole upper lands 1 arranged in the same arrangement as the BGA-side pads 5 are provided on printed circuit board 7, these through-hole upper lands 1 being connected with through-hole bottom face lands (through-hole bottom lands) 9 by means of through-hole internal portions 8. The through-hole upper portions, internal portions and bottom portions are each connected with other components through an upper layer pattern, inner layer pattern, and bottom layer pattern, not shown.

In order to attach this BGA and printed circuit board, solder paste 3 is applied beforehand to through-hole upper lands 1 or solder balls 6, and attachment is effected by introducing the solder balls 6 into the holes of the through-hole upper lands 1. After attachment, the BGA and printed circuit board are heated by a reflow device or the like, not shown, melting solder 6.

Figure 7:
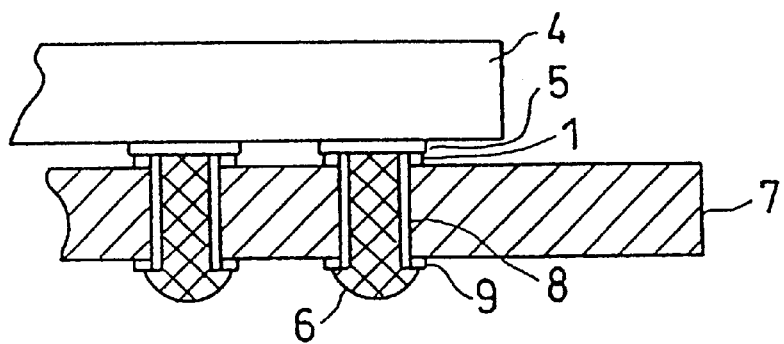
FIG. 7 is a detail cross-sectional view illustrating the condition after mounting in a first embodiment of the present invention.

FIG. 7 is a view showing the condition after mounting of the BGA on the printed circuit board. Solder 6 of FIG. 6 melts, wetting and spreading into through-hole upper lands 1; solder 6 penetrates into the interior of the through-holes due to the capillary effect and wetting effect and furthermore achieves wetting and spreading as far as the through-hole bottom face lands 9, thereby achieving soldering and forming solder fillets with the BGA-side pads 5 and through-hole upper lands 1 being stuck securely together. That soldering has been performed correctly can be confirmed by visually confirming this condition.

Also, it becomes possible to employ soldering automatic inspection devices such as are generally used for solder fillet inspection of mounted components, thereby enabling a considerable reduction of inspection time to be achieved.

Also, due to the capillary action and wetting action of the through-holes, even if excess solder paste 3 is supplied, the excess solder is melted by the heating and collects on the bottom lands 9 of the through-holes after passing through the through-holes, so no solder bridges 12 are generated on the side of the BGA pads 5.

Figure 8:
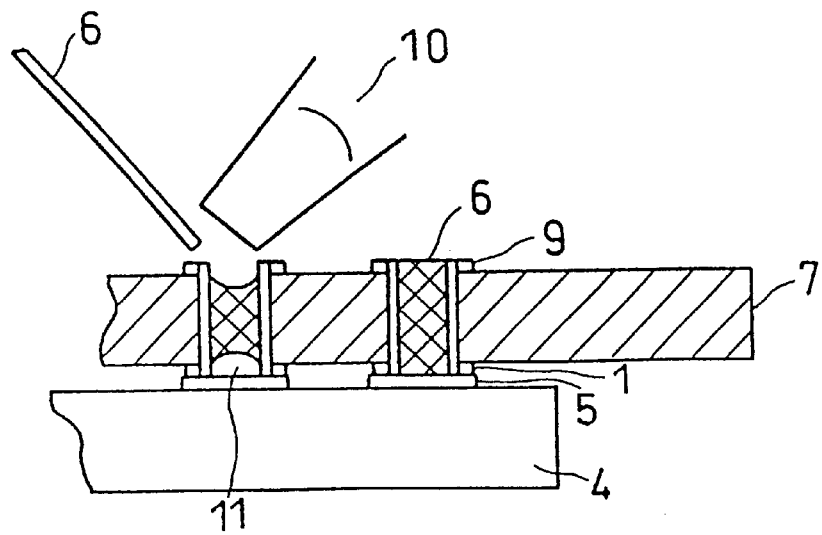
FIG. 8 is a detail cross-sectional view illustrating a repaired condition after mounting in the first embodiment of the present invention.

In addition, FIG. 8 shows the repaired condition in this embodiment. As shown in this Figure, even if solder gaps 11 are generated at locations where solder 6 in the form of BGA solder balls is absent, repair can be effected by supplying solder 6 from the through-hole bottom lands 9 by heating with soldering iron 10.

Second Embodiment

Figure 9:
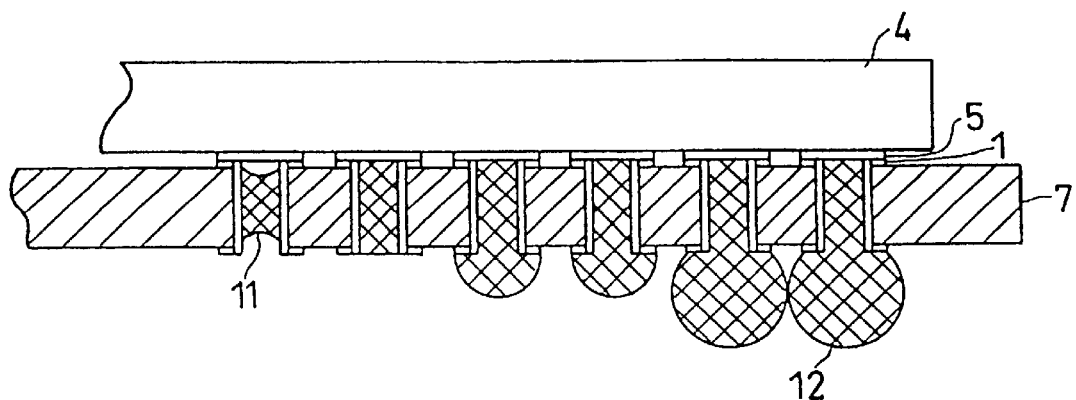
FIG. 9 is a detail cross-sectional view illustrating the condition after mounting in a second embodiment of the present invention.

Next, a method of BGA mounting according to a second embodiment of the present invention is described. FIG. 9 is a view showing the upper and lower limits of solder volume of a BGA mounting method according to the second embodiment of present invention.

As a result of evaluation tests of the present method of BGA mounting, it was found that solder gaps 11 are produced by separation of solder 6 from BGA pads 5 if the amount of solder in the through-holes is small, due to the action of surface tension of solder 6 in the direction of the interior of the through-holes. A minimum amount of solder, in the amount of the internal volume of the through-holes, is therefore necessary to eliminate the phenomenon of solder gaps 11.

Also, if the amount of solder is too great, a condition is produced in which solder 6 swells out over the through-hole bottom lands 9, coming into contact with solder 6 above adjacent through-hole bottom lands 9 and so giving rise to solder bridges 12.

Accordingly, though this is also controlled by the distance between adjacent pads, solder fillets should be formed such as not to protrude beyond the minimum pad size. A volume arrived at by combining the through-hole internal volume with the volume of a hemisphere whose radius is the dimension of the through-hole bottom land 9 may therefore be taken as the maximum amount of solder.

If the volume of solder 6 constituted by the BGA solder balls i.e. spherically shaped solder is taken as $V_{BGA}$ and the volume of solder paste 3 is taken as $V_{PASTE}$, the total solder volume at the location of a single soldered joint is therefore $V_{SOLDER} = V_{BGA} + V_{PASTE}$. Also, if the through-hole volume is taken as $V_{TH}$, and the volume of solder on the hemisphere above a through-hole bottom land 9 is taken as $V_{LAND}$, the total volume $V_{SOLDER}$ required for this soldered joint should satisfy $V_{TH} < V_{SOLDER} < V_{TH} + V_{RLAND}$.

If the BGA to be mounted is determined, by checking the BGA solder ball size, and calculating the total amount of solder from the amount of solder paste applied, the total amount of solder can be controlled so as to satisfy the above calculation formula by altering the internal diameter of the through holes at the printed circuit board design stage, by altering the thickness of the printed circuit board 7, or by altering the dimensions of the through-hole bottom lands 9.

Control such as to satisfy the above calculation expressions can also be achieved by controlling the applied amount of solder paste 3.

With this embodiment, it becomes possible to calculate the optimum solder amount in a straightforward fashion for various combinations of sizes of BGA solder balls and through-holes, making it possible to achieve stable BGA mounting with no problems regarding soldering.

A design standard can also be constituted in respect of the pad size and through-hole diameter etc. of the printed circuit board to which the present method of BGA mounting is applied.

Third Embodiment

Figure 10:
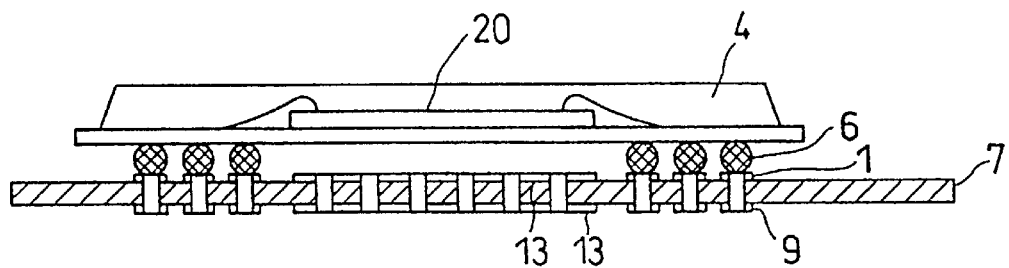
FIG. 10 is a detail cross-sectional view illustrating the condition prior to mounting in a third embodiment of the present invention.
Figure 11:
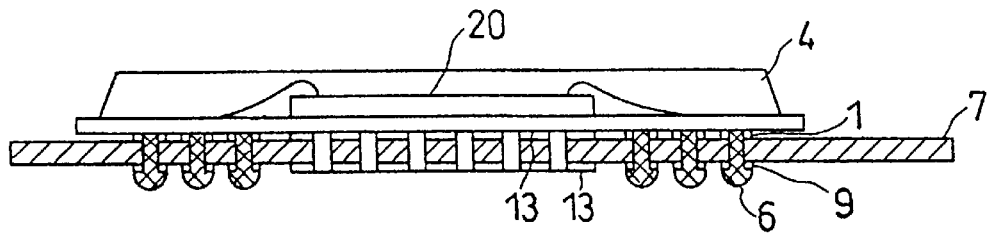
FIG. 11 is a detail cross-sectional view illustrating the condition after mounting in the third embodiment of the present invention.

Next, a method of BGA mounting according to a third embodiment of the present invention is described using FIG. 10 and FIG. 11.

FIG. 10 is a view showing the condition prior to mounting the BGA on the printed circuit board. As shown in this Figure, the general construction of the BGA is that BGA-side pads 5 constituting electrodes are arranged in grid fashion on the underside of BGA body 4, and solder balls 6 are connected with the surfaces of BGA-side pads 5. Also, the general construction of the printed circuit board is that printed circuit board 7 is provided with through-hole upper lands 1 arranged in the same arrangement as BGA-side pads 5, these through-hole upper lands 1 being connected with through-hole bottom lands 9 through through-hole internal portions 8. The through-hole upper portions, internal portions and bottom portions are each connected with other components through an upper layer pattern, inner layer pattern, and bottom layer pattern, not shown.

Furthermore, ground layer patterns 13 in which the entire surface of the through-hole peripheries is covered with copper foil in a specified range are provided in positions corresponding to the position of the silicon chip 20 of the BGA in printed circuit board 7. Identical ground layer patterns 13 are also arranged on the bottom face of printed circuit board 7. The top and bottom ground layer patterns 13 are connected by the through-holes.

Furthermore, in order to attach this BGA and printed circuit board, solder paste 3 is applied beforehand to the through-hole upper lands 1 or solder balls and the solder balls 6 are fitted into and attached in the holes of the through-hole upper lands 1. After attachment, the BGA and printed circuit board are heated using a reflow device or the like, not shown, to melt the solder 6.

FIG. 11 is a view showing the condition after mounting the BGA on the printed circuit board. Solder 6 of FIG. 10 melts, wetting and spreading into through-hole upper lands 1; solder 6 penetrates into the interior of the through-holes due to the capillary effect and wetting effect and, with the effect of the BGA's own weight, the BGA-side pads 5 and through-hole upper lands 1 are stuck securely together. Accompanying this, the BGA body 4 and ground layer patterns 13 of the printed circuit board are stuck securely together, with the result that the heat generated on passage of current through the BGA can be efficiently radiated from the copper, which is of high thermal conductivity, after passing through the printed circuit board. Also, a BGA mounting which is little influenced by noise can be obtained by connecting the ground layer patterns 13 to earth.

Fourth Embodiment

Figure 12:
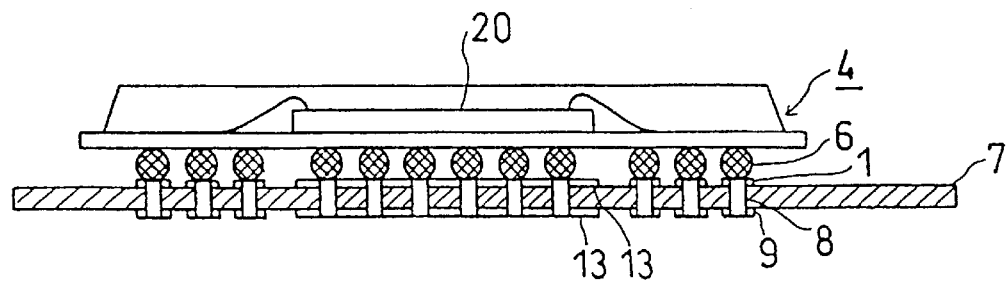
FIG. 12 is a detail cross-sectional view illustrating the condition prior to mounting in a fourth embodiment of the present invention.
Figure 13:
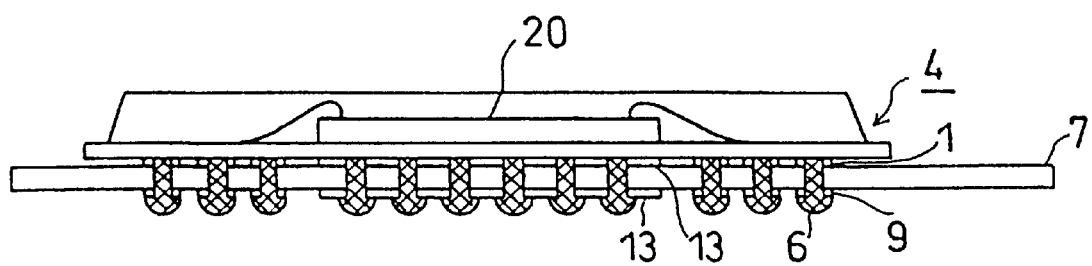
FIG. 13 is a detail cross-sectional view illustrating the condition after mounting in a fourth embodiment of the present invention.

Next, a BGA mounting method according to a fourth embodiment of the present invention is described using FIG. 12 and FIG. 13.

FIG. 12 is a view showing the condition prior to mounting the BGA on the printed circuit board. As shown in this Figure, the general construction of the BGA is that BGA-side pads 5 are arranged in grid fashion as electrodes on the underside of BGA body 4 and, in addition, solder balls 6 are connected to the surface of the BGA-side pads 5. Furthermore, solder balls 6 are connected at the position of the silicon chip 20 of the BGA. Also, the general construction of the printed circuit board is that through-hole upper lands 1 arranged in the same arrangement as the BGA-side pads 5 are provided on printed circuit board 7, these through-hole upper lands 1 being connected with through-hole bottom face lands 9 by means of through-hole internal portions 8. The through-hole upper portions, internal portions and bottom portions are each connected with other components through an upper layer pattern, inner layer pattern, and bottom layer pattern, not shown. Furthermore, ground layer patterns 13 in which the entire surface of the through-hole peripheries is covered with copper foil in a specified range are provided in positions corresponding to the position of the silicon chip 20 of the BGA in printed circuit board 7. Identical ground layer patterns 13 are also arranged on the bottom face of printed circuit board 7. The top and bottom ground layer patterns 13 are connected by the through-holes.

Furthermore, in order to attach this BGA and printed circuit board, solder paste 3 is applied beforehand to the through-hole upper lands 1 or solder balls 6 and the solder balls 6 are fitted into and attached in the holes of the through-hole upper lands 1. After attachment, the BGA and printed circuit board are heated using a reflow device or the like, not shown, to melt the solder 6.

FIG. 13 is a view showing the condition after mounting the BGA on the printed circuit board. Solder 6 of FIG. 12 melts, wetting and spreading into through-hole upper lands 1; solder penetrates into the interior of the through-holes due to the capillary effect and wetting effect and, with the effect of the BGA's own weight, the BGA-side pads 5 and through-hole upper lands are stuck securely together. Accompanying this, the BGA body 4 and ground layer patterns 13 of the printed circuit board are soldered together, with the result that the heat generated on passage of current through the BGA can be efficiently radiated from the copper, which is of high thermal conductivity, by being transmitted to the bottom face of the printed circuit board through the through-holes.

As described above, with the method of BGA mounting of the embodiments of the present invention, solder fillets are formed using as joining material solder paste and solder balls attached to the BGA and, whilst joining by soldering the pads and through-hole inside walls of the printed circuit board which are in the through-hole positions of the printed circuit board with the BGA pads, these are led to the through-hole bottom face lands, so visual inspection of the BGA soldered joints can be achieved, making the conventional inspection of the BGA using X-rays etc. unnecessary; ease of inspection of the mounted printed circuit board is thereby improved.

Also, since it becomes possible to effect repair of defective soldering locations of the BGA using a soldering iron 10, the printed circuit board yield can be improved.

Furthermore, a design standard can be established when applying a BGA mounting method according to the embodiments of the present invention.

Moreover, efficient radiation of the heat generated on passage of current through the BGA can be achieved by attaching a ground layer pattern to the printed circuit board.

Obviously, numerous additional modifications and variations of the present invention are possible in light of the above teachings. It is therefore to be understood that within the scope of the appended claims, the present invention may be practiced otherwise than as specially described herein.

What is claimed is:

1. A ball grid array mounting method, in which a ball grid array is soldered onto a printed circuit board comprising:

(a) applying solder paste beforehand onto at least one of a plurality of lands of a printed circuit board which are in a position of through-holes of said printed circuit board and a plurality of solder balls of said ball grid array which are connected with pads of said ball grid array;

(b) attaching and superimposing said through-holes of said printed circuit board and said solder balls of said ball grid array;

(c) melting said solder bails and said solder paste by heating both said ball grid array and said printed circuit board, to flow into said through-holes, to be led into through-hole bottom face lands which said solder balls and said solder paste wet and where said solder balls and said solder paste spread out; and (d) sticking and effecting said pads of said ball grid array securely together with said lands of said printed circuit board, which are in the positions of said through-holes of said printed circuit board, whereby solder fillets are formed on said through-hole bottom face lands.

2. The ball grid array mounting method according to claim 1, wherein a total amount of solder obtained by adding a solder and a solder paste required for solder joining of said ball grid array pads and said lands of said printed circuit board which are in the positions of said through-holes of said printed circuit board is an amount greater than a through-hole volume and less than said through-hole volume plus a solder volume of hemispheres on said through-hole bottom face lands.

3. The BGA mounting method according to claim 1, wherein a ground layer pattern is provided in a position of said printed circuit board corresponding to a position of a silicon chip of said BGA, and said BGA body and said ground layer pattern are securely stuck together.

* * * * *